(12) United States Patent
Yue et al.

(10) Patent No.: US 9,281,321 B2
(45) Date of Patent: Mar. 8, 2016

(54) TFT ARRAY SUBSTRATE, DISPLAY PANEL AND DISPLAY DEVICE

(71) Applicants: Xiamen Tianma Micro-Electronics Co., Ltd., Xiamen (CN); Tianma Micro-Electronics Co., Ltd., Shenzhen (CN)

(72) Inventors: Qin Yue, Xiamen (CN); Boping Shen, Xiamen (CN); Yanxi Ye, Xiamen (CN)

(73) Assignees: Xiamen Tianma Micro-Electronics Co., Ltd., Xiamen (CN); Tianma Micro-Electronics Co., Ltd., Shenzhen (CN)

( * ) Notice: Subject to any disclaimer, the term of this patent is extended or adjusted under 35 U.S.C. 154(b) by 154 days.

(21) Appl. No.: 14/300,670

(22) Filed: Jun. 10, 2014

(65) Prior Publication Data

US 2015/0179667 A1    Jun. 25, 2015

(30) Foreign Application Priority Data

Dec. 23, 2013 (CN) .......................... 2013 1 0712762

(51) Int. Cl.
*G02F 1/1343* (2006.01)
*H01L 27/12* (2006.01)
*G02F 1/1335* (2006.01)
*G02F 1/1368* (2006.01)
*G02F 1/1337* (2006.01)

(52) U.S. Cl.
CPC ............ *H01L 27/124* (2013.01); *G02F 1/1368* (2013.01); *G02F 1/13439* (2013.01); *G02F 1/133514* (2013.01); *G02F 1/134309* (2013.01); *G02F 1/133707* (2013.01); *G02F 2001/13373* (2013.01); *G02F 2001/134372* (2013.01); *G02F 2201/121* (2013.01); *G02F 2201/128* (2013.01)

(58) Field of Classification Search
CPC .................................................... G02F 1/13439
See application file for complete search history.

(56) References Cited

U.S. PATENT DOCUMENTS

| | | | |
|---|---|---|---|
| 9,213,206 B2 * | 12/2015 | Kimura | G02F 1/13439 349/140 |
| 2013/0088672 A1 | 4/2013 | Shin et al. | |
| 2013/0278878 A1 * | 10/2013 | Song | G02F 1/133707 349/139 |
| 2015/0177571 A1 * | 6/2015 | Yoshida | G02F 1/134363 349/33 |
| 2015/0261044 A1 * | 9/2015 | Nakanishi | G02F 1/133707 349/123 |

FOREIGN PATENT DOCUMENTS

| | | |
|---|---|---|
| CN | 102243405 A | 11/2011 |
| JP | 2010169994 A | 8/2010 |

* cited by examiner

*Primary Examiner* — Timothy L Rude
(74) *Attorney, Agent, or Firm* — Alston & Bird LLP

(57) ABSTRACT

A TFT array substrate includes a first electrode layer and a second electrode layer disposed below the first electrode layer. The first electrode layer includes a strip-like first electrode, and the second electrode layer is a sheet-like electrode. The strip-like first electrode includes a bent portion. The second electrode layer includes at least one opening, the opening is located below the bent portion.

20 Claims, 5 Drawing Sheets

TFT ARRAY SUBSTRATE, DISPLAY PANEL AND DISPLAY DEVICE

CROSS-REFERENCES TO RELATED APPLICATIONS

This application claims the benefit of priority to Chinese Patent Application No. 201310712762.X, filed with the Chinese Patent Office on Dec. 23, 2013 and entitled "TFT ARRAY SUBSTRATE, DISPLAY PANEL AND DISPLAY DEVICE", the content of which is incorporated herein by reference in its entirety.

TECHNICAL FIELD

The present disclosure relates to the field of display technique, and in particular to a TFT array substrate, a display panel and a display device.

BACKGROUND OF THE INVENTION

Currently, a display device, such as a Liquid Crystal Display (LCD) and an Organic Light Emit Display (OLED) is more and more popular, however, the display device has a poor display quality.

BRIEF SUMMARY OF THE INVENTION

In view of the above, there is provided a TFT array substrate, a display panel and a display device according to embodiments of the disclosure.

A TFT array substrate is provided, which includes a first electrode layer; and a second electrode layer disposed below the first electrode layer, where the first electrode layer includes a strip-like first electrode, and the second electrode layer is a sheet-like electrode, the strip-like first electrode includes a bent portion, and the second electrode layer includes at least an opening, the opening is located below the bent portion.

A display panel is further provided according to the disclosure. The display panel includes the TFT array substrate mentioned above; a color filter substrate disposed opposite to the TFT array substrate; and a liquid crystal layer disposed between the TFT array substrate and the color filter substrate.

A display device is further provided according to the disclosure. The display device includes the display panel mentioned above.

DETAILED DESCRIPTION OF THE INVENTION

To make the above objects, features and advantages of the disclosure more obvious and easy to be understood, the disclosure is described in detail below in conjunction with the drawings and the embodiments.

It should be noted that more specific details are set forth in the following descriptions for sufficient understanding of the disclosure, however the disclosure may be implemented in other ways different from the way described herein, similar extensions may be made by those skilled in the art without departing from the spirit of the disclosure, therefore the disclosure is not limited to particular embodiments disclosed hereinafter.

The TFT array substrate in the embodiments of the disclosure may be manufactured by an amorphous silicon process, a low temperature polysilicon process or an oxide process. The related processes may be performed according to conventional technologies well known in the art, which are not described herein.

Figure 1:
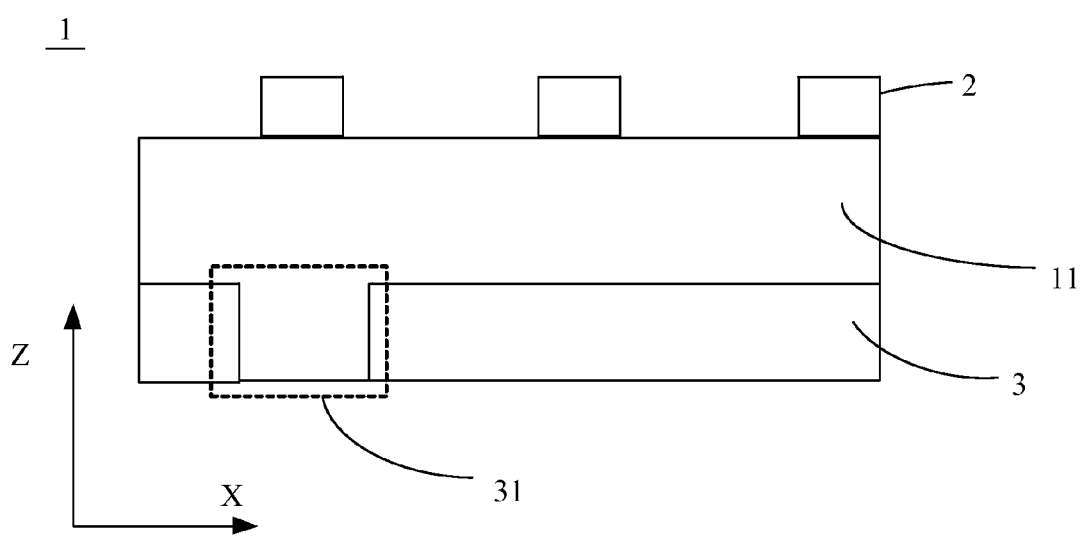
FIG. 1 is a schematic structural diagram of a TFT array substrate according to an embodiment of the disclosure.
Figure 2:
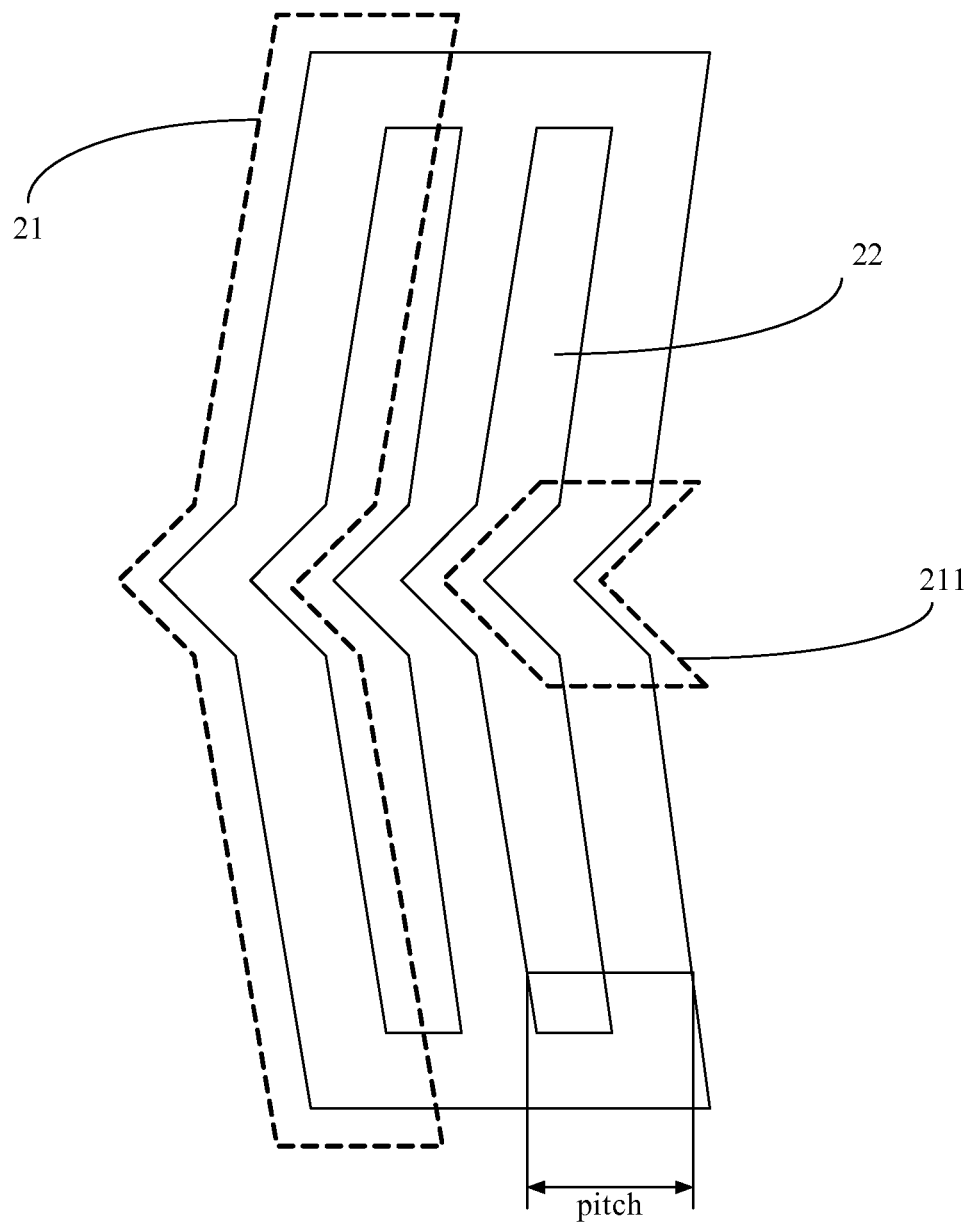
FIG. 2 is a top view of a first electrode layer according to an embodiment of the disclosure.
Figure 3:
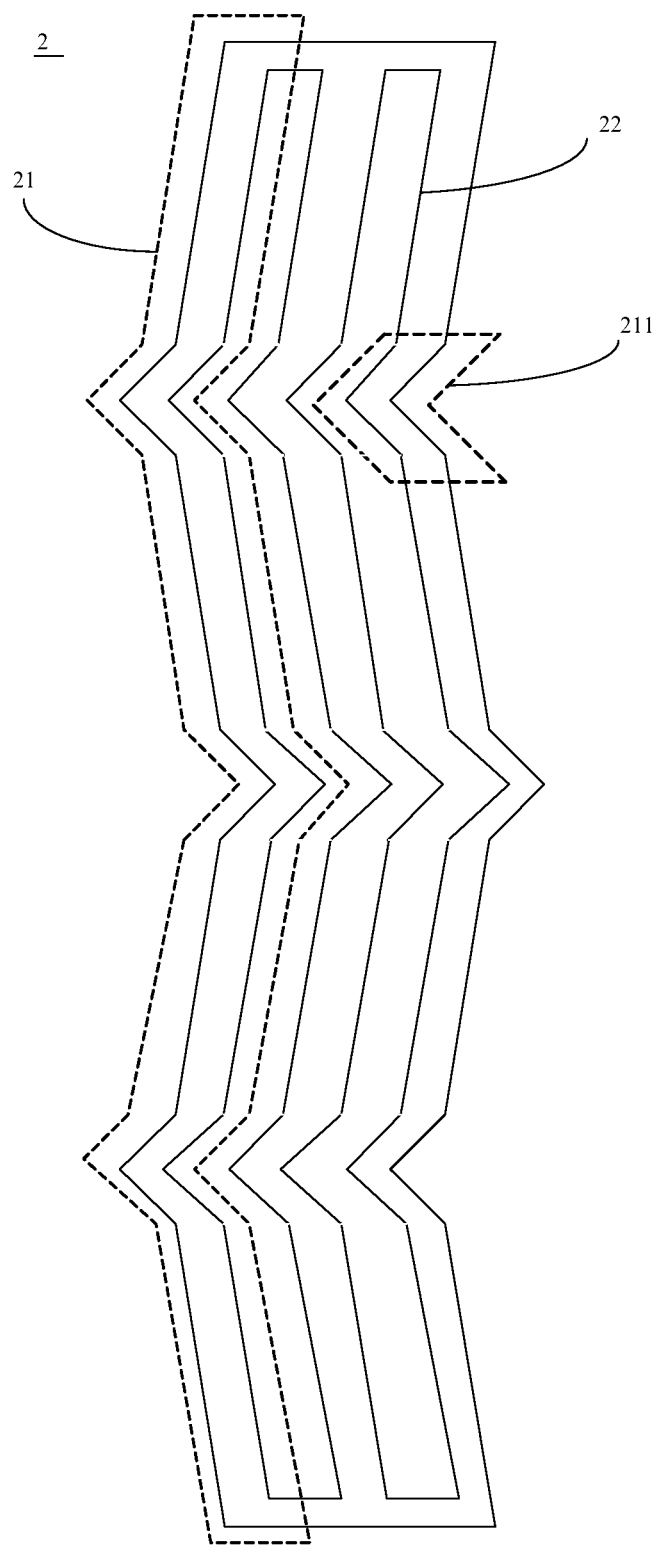
FIG. 3 is a top view of a first electrode layer according to an embodiment of the disclosure.

As shown in FIG. 1, a TFT array substrate 1 according to an embodiment of the disclosure includes a first electrode layer 2, a second electrode layer 3 disposed below the first electrode layer 2, and an insulating layer 11 disposed between the first electrode layer 2 and the second electrode layer 3. The second electrode layer 3 is a sheet-like electrode, i.e., the second electrode layer 3 is disposed on the entire surface of the substrate (not shown) of the TFT array substrate 1. As shown in FIGS. 1 and 2, the first electrode layer 2 includes a strip-like first electrode 21. The first electrode layer 2 further includes at least one slit 22, the slit 22 is disposed between every two strip-like first electrodes 21 adjacent to each other. The strip-like first electrode 21 includes one or more bent portions 211. The second electrode layer 3 includes at least an opening 31. The opening 31 is disposed below (for example, under) the bent portion 211. The number of the bent portions 211 of each strip-like first electrode is not limited in the embodiments of the disclosure. Each strip-like first electrode 21 has three bent portions 211, for example, as shown in FIG. 3.

Figure 4:
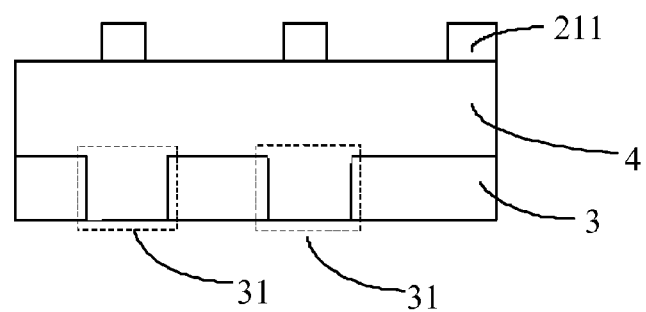
FIG. 4 is a schematic structural diagram of a TFT array substrate according to an embodiment of the disclosure.

In addition, as shown in FIG. 4, the opening 31 extends through the second electrode layer 3. The number of the openings 31 is less than or equal to the number of the bent portions 211 (It should be noted that the number of the openings 31 is not limited in this embodiment. It is understood that the two openings 31 in FIG. 4 are arbitrary chosen for illustrating an example embodiment and should not be limiting. It is understood that the number of the openings can be any integer number based on requirements of specific applications).

Figure 5:
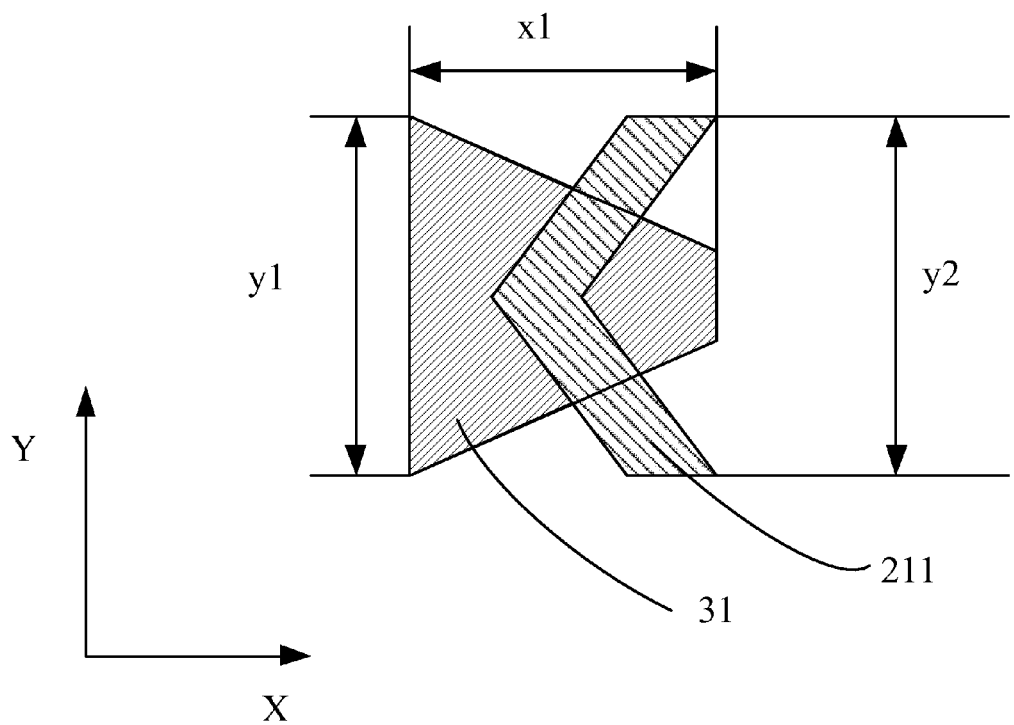
FIG. 5 is a topview of a strip-like first electrode and an opening of a TFT array substrate according to an embodiment of the disclosure.

As shown in FIG. 5, the largest length y1 of the opening 31 in a first direction Y is less than or equal to the largest length y2 of the bent portion 211 in the first direction Y. As shown in FIG. 2 and FIG. 5, the largest length x1 of the opening 31 in a second direction X is less than or equal to the pitch between two strip-like first electrodes 21 adjacent to each other. The length of the opening 31 in the first direction Y is gradually decreased along the second direction X. As shown in FIG. 1 and FIG. 5, the first direction Y, the second direction X and the third direction Z are perpendicular to each other in space.

Furthermore, the first electrode layer 2 is a pixel electrode layer, and the second electrode layer 3 is a common electrode layer (that is, a common potential is applied to the second electrode layer 3). Alternatively, the first electrode layer 2 is a common electrode layer (that is, a common potential is applied to the first electrode layer 2), and the second electrode layer 3 is a pixel electrode layer.

In the TFT array substrate according to an embodiment of the disclosure, the opening 31 is disposed on the second electrode layer 3 and under the bent portion 211 of the strip-like first electrode 21. Therefore, the overlapping area between the bent portion 211 of the strip-like first electrode 21 and the second electrode layer 3 may be reduced, thereby decreasing an electric field in the overlapping region between the bent portion 211 of the strip-like first electrode 21 and the second electrode layer 3 and reducing the influence of the electric field applying on liquid crystal alignment, thus decreasing the disclinations, so the yield of the substrates may be increased and the display quality may be improved.

Figure 6:
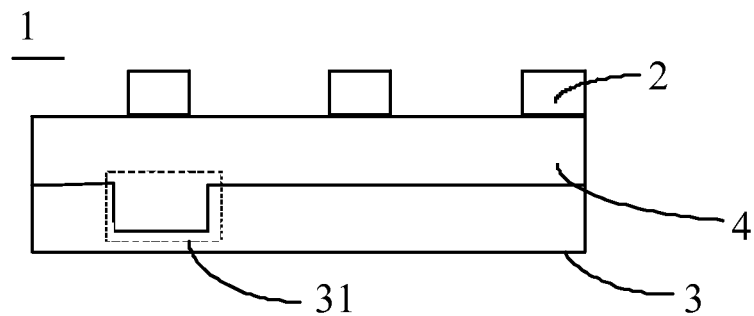
FIG. 6 is a schematic structural diagram of a TFT array substrate according to an embodiment of the disclosure.

In another embodiment of the disclosure, descriptions of the similar parts to the TFT array substrate 1 according to the above embodiment mentioned above are omitted. In this embodiment, the opening 31 does not extend through the second electrode layer 3 and the opening 31 faces the first electrode layer 2, as shown in FIG. 6.

Figure 7:
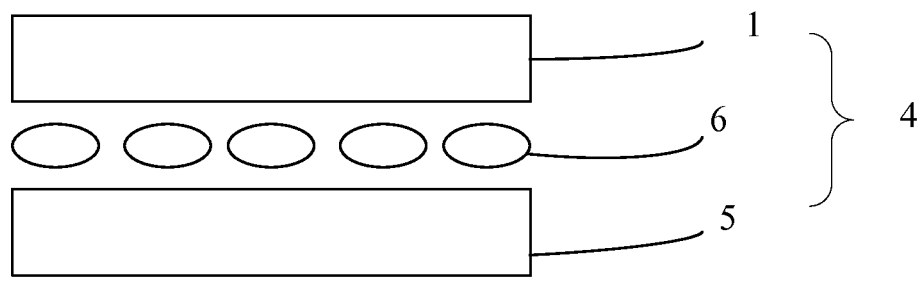
FIG. 7 is a schematic structural diagram of a display panel according to an embodiment of the disclosure.

As shown in FIG. 7, a display panel 4 is further provided according to an embodiment. The display panel 4 includes a TFT array substrate 1, a color filter substrate 5 which is located opposite to the TFT array substrate 1, and a liquid crystal layer 6 which is located between the TFT array substrate 1 and the color filter substrate 5. The TFT array substrate 1 may be the TFT array substrate according to any embodiment mentioned above. Generally, the display panel may be a liquid crystal display panel.

Figure 8:
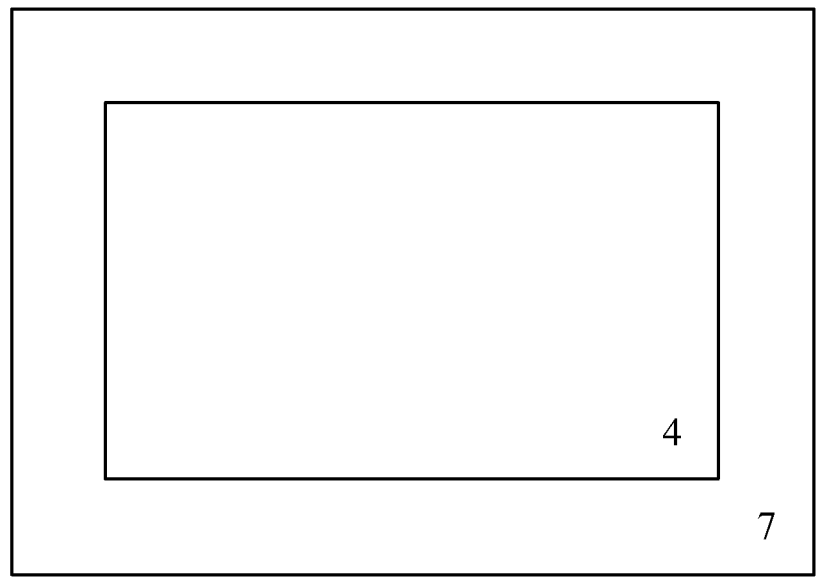
FIG. 8 is a schematic structural diagram of a display device according to an embodiment of the disclosure.

As shown in FIG. 8, a display device 7 including a display panel 4 is further provided according to an embodiment of the disclosure. The display panel 4 may be the display panel according to any embodiment mentioned above. The display device is not limited to a liquid crystal display device. Generally, the display device may be a liquid crystal display device. Alternatively, the display device may be an organic light emitting display device.

Conventionally, scratches (i.e., disclinations) may occur in a display panel when a finger (contact force by a user) or pressing head (indenter) slides on the display panel. The scratches may gradually disappear over time. The scratches are occurred due to disordered alignments of the liquid crystal molecules taking in the view from micro, the disordered alignments of the liquid crystal molecules causes that the luminance of a slided region is different from the luminance of an un-slided region. The principle of the occurrence of the disclinations may be described as follows. An electric field in a second direction and an electric field in a third direction (as shown in FIG. 1 and FIG. 5, the electric field in the second direction is parallel to the second direction X; and the electric field in the third direction is parallel to the third direction Z, i.e., the electric field in the third direction is perpendicular to the whole TFT array substrate) are generated between a bent portion and a second electrode layer below the bent portion when the display panel is pressed by an external force. Therefore, the existence of the electric field in the second direction and the electric field in the third direction results in disordered alignments of the liquid crystal molecules under the bent portion of a strip-like first electrode, and thus the disclinations may appear and be diffused to the whole pixel region. The liquid crystal molecules may not return to its original alignment or may return slowly to its original alignment after the external force is removed.

However, in the display panel and display device according to the embodiments of the disclosure, an opening is disposed on a second electrode layer and under a bent portion of a strip-like first electrode. Therefore, the overlapping area between the bent portion of the strip-like first electrode and the second electrode layer may be reduced, thereby decreasing an electric field in the overlapping region between the bent portion of the strip-like first electrode and the second electrode layer and reducing the influence of the electric field in the overlapping region between the bent portion of the strip-like first electrode and the second electrode layer applying on liquid crystal alignment, thus decreasing the disclinations, so the yield of the substrates may be increased and the display quality may be improved.

It is obvious that many modifications and variations may be made by those skilled in the art without departing from the spirit and the scope of the disclosure. Therefore, it is intended that the disclosure covers the modifications and variations of this disclosure provided the modifications and variations come within the scope of the claims and their equivalents.

What is claimed is:

1. A TFT array substrate, comprising:
a first electrode layer; and
a second electrode layer disposed below the first electrode layer,
wherein the first electrode layer comprises a strip-like first electrode, and the second electrode layer is a sheet-like electrode, the strip-like first electrode comprises one or more bent portions, and the second electrode layer comprises at least one opening, the opening is located below the one or more bent portions.

2. The TFT array substrate according to claim 1, wherein a number of the at least one opening is less than or equal to a number of the one or more bent portions.

3. The TFT array substrate according to claim 1, wherein the at least one opening extends through the second electrode layer.

4. The TFT array substrate according to claim 1, wherein the at least one opening does not extend through the second electrode layer.

5. The TFT array substrate according to claim 4, wherein the at least one opening faces the first electrode layer.

6. The TFT array substrate according to claim 1, wherein the largest length of the at least one opening in a first direction is less than or equal to the largest length of the one or more bent portions in the first direction.

7. The TFT array substrate according to claim 1, wherein the largest length of the at least one opening in a second direction is less than or equal to a pitch between two strip-like first electrodes adjacent to each other.

8. The TFT array substrate according to claim 1, wherein the length of the at least one opening in a first direction is gradually decreased along the second direction.

9. The TFT array substrate according to claim 1, wherein the first electrode layer is a pixel electrode layer and the second electrode layer is a common electrode layer; or the first electrode layer is a common electrode layer and the second electrode layer is a pixel electrode layer.

10. A display panel comprising a TFT array substrate, the TFT array substrate comprising:
a first electrode layer; and
a second electrode layer disposed below the first electrode layer,
wherein the first electrode layer comprises a strip-like first electrode, and the second electrode layer is a sheet-like electrode, the strip-like first electrode comprises one or more bent portions, and the second electrode layer comprises at least one opening, the at least one opening being located below the one or more bent portions;

a color filter substrate disposed opposite to the TFT array substrate; and a liquid crystal layer disposed between the TFT array substrate and the color filter substrate.

11. The display panel according to claim 10, wherein a number of the at least one opening is less than or equal to a number of the one or more bent portions.

12. The display panel according to claim 10, wherein the at least one opening extends through the second electrode layer.

13. The display panel according to claim 10, wherein the at least one opening does not extend through the second electrode layer.

14. The display panel according to claim 13, wherein the at least one opening faces the first electrode layer.

15. The display panel according to claim 10, wherein the largest length of the at least one opening in a first direction is less than or equal to the largest length of the one or more bent portions in the first direction.

16. The display panel according to claim 10, wherein the largest length of the at least one opening in a second direction is less than or equal to a pitch between two strip-like first electrodes adjacent to each other.

17. The TFT array substrate according to claim 10, wherein the length of the at least one opening in a first direction is gradually decreased along the second direction.

18. The TFT array substrate according to claim 10, wherein the first electrode layer is a pixel electrode layer and the second electrode layer is a common electrode layer; or the first electrode layer is a common electrode layer and the second electrode layer is a pixel electrode layer.

19. A display device comprising a display panel, wherein the display panel comprises:
　a TFT array substrate, the TFT array substrate comprising:
　　a first electrode layer; and
　　a second electrode layer disposed below the first electrode layer,
　wherein the first electrode layer comprises a strip-like first electrode, and the second electrode layer is a sheet-like electrode, the strip-like first electrode comprises one or more bent portions, and the second electrode layer comprises at least one opening, the at least one opening being located below the bent portion;
　a color filter substrate located opposite to the TFT array substrate; and
　a liquid crystal layer located between the TFT array substrate and the color filter substrate.

20. The display device according to claim 19, wherein the largest length of the at least one opening in a first direction is less than or equal to the largest length of the one or more bent portions in the first direction.

* * * * *